(12) United States Patent
Lee et al.

(10) Patent No.: US 7,154,348 B2
(45) Date of Patent: Dec. 26, 2006

(54) FREQUENCY SYNTHESIZER USING A WIDE-BAND VOLTAGE CONTROLLED OSCILLATOR AND A FAST ADAPTIVE FREQUENCY CALIBRATION METHOD

(75) Inventors: Han-il Lee, Hwaseong-si (KR); In-chul Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/942,119

(22) Filed: Sep. 15, 2004

(65) Prior Publication Data
US 2005/0083137 A1  Apr. 21, 2005

(30) Foreign Application Priority Data
Oct. 18, 2003  (KR)  ........................ 10-2003-0072791

(51) Int. Cl.
*H03L 7/00* (2006.01)
(52) U.S. Cl. .............................. 331/34; 331/11; 331/44
(58) Field of Classification Search .................. 331/34, 331/179, 11, 44
See application file for complete search history.

(56) References Cited

U.S. PATENT DOCUMENTS 6,229,400 B1 * 5/2001 McCollough et al. ......... 331/17
6,710,664 B1 * 3/2004 Humphreys et al. ......... 331/11
2002/0075080 A1 * 6/2002 Nelson et al. ................ 331/11

FOREIGN PATENT DOCUMENTS

KR  2002-0005610  1/2002

* cited by examiner

Primary Examiner—Joseph Chang
(74) Attorney, Agent, or Firm—F. Chau & Associates, LLC

(57) ABSTRACT

A frequency synthesizer is provided. The frequency synthesizer includes an adaptive frequency calibration circuit and a phase locked loop (PLL). The frequency synthesizer performs in a frequency lock mode and in a phase lock mode. In the frequency lock mode, the adaptive frequency calibration circuit compares the frequency of an input signal with the frequency of an output signal of a voltage controlled oscillator of the PLL and outputs control bits as a result of the comparison. The voltage controlled oscillator has a plurality of operating characteristic curves and selects a curve from among the plurality of operating characteristic curves in response to the control bits. In the phase lock mode, the PLL controls an output phase of the voltage controlled oscillator based on a tuning voltage from the selected operating characteristic curve.

18 Claims, 7 Drawing Sheets

FREQUENCY SYNTHESIZER USING A WIDE-BAND VOLTAGE CONTROLLED OSCILLATOR AND A FAST ADAPTIVE FREQUENCY CALIBRATION METHOD

CROSS-REFERENCE TO RELATED APPLICATION

This application claims priority to Korean Patent Application No. 2003-72791, filed on Oct. 18, 2003, in the Korean Intellectual Property Office, the disclosure of which is incorporated herein in its entirety by reference.

BACKGROUND OF THE INVENTION

1. Technical Field

The present invention relates to a frequency synthesizer, and more particularly, to a frequency synthesizer using a wide-band voltage controlled oscillator and a fast adaptive frequency calibration method.

2. Discussion of the Related Art

An integer-N phase locked loop (PLL) has been widely used as a radio frequency (RF) synthesizer for an RF transceiver. Currently, however, a fractional-N PLL has been more widely used as an RF synthesizer for wireless communication applications.

The fractional-N PLL provides a wide bandwidth with narrow channel spacing and is free to some extent from various restrictions that are imposed on PLLs in terms of fast lock time, phase noise, and reference spurious. In addition, the fractional-N PLL provides an agile lock time and a fine frequency resolution. Therefore, the fractional-N PLL has been widely used in an RF transceiver for general packet radio services (GPRS), which generally require a fast lock time.

Many currently used wireless RF transceivers require a wide-band frequency synthesizer and a local oscillation signal generator. The local oscillation signal generator provides a variety of local oscillation signals to an RF transceiver. Currently, various methods for providing a wide frequency band to a frequency synthesizer are available. One such method is directed to increasing the gain of a voltage controlled oscillator, i.e., a ratio of the frequency to a tuning voltage. However, as the voltage of the voltage controlled oscillator increases, its phase noise performance deteriorates. In addition, in order to have a wide frequency band coverage of, for example, 500 MHz or higher with a low voltage of 3V, the gain of the voltage controlled oscillator should be increased to 200 MHz/V or higher. However, a gain of 200 MHz/V or higher is typically too much for conventional low phase noise applications to handle.

SUMMARY OF THE INVENTION

According to an aspect of the present invention, there is provided a frequency synthesizer having a phase locked loop (PLL). The frequency synthesizer includes a voltage controlled oscillator, which has a plurality of operating characteristic curves; and an adaptive frequency calibration circuit, which, in a frequency lock mode, receives an input signal, and an output signal of the voltage controlled oscillator, compares a frequency of the input signal with a frequency of the output signal of the voltage controlled oscillator, and outputs control bits as a result of the comparison, wherein the voltage controlled oscillator selects a curve from among the plurality of operating characteristic curves in the frequency lock mode in response to the control bits.

The adaptive frequency calibration circuit may include a first counter, which receives the input signal and counts the frequency of the input signal; a second counter, which receives the output signal of the voltage controlled oscillator and counts the frequency of the output signal of the voltage controlled oscillator; a comparator, which receives an output signal of the first counter and an output signal of the second counter, compares the output signal of the first counter and the output signal of the second counter, and outputs a comparison signal as a result of the comparison; and a state machine, which receives the comparison signal from the comparator and outputs the control bits in response to the comparison signal.

The adaptive frequency calibration circuit may include a multiplier, which receives the input signal and multiplies the frequency of the input signal by an integer; a first counter, which receives a frequency output from the multiplier and counts the received frequency; a second counter, which receives the output signal of the voltage controlled oscillator and counts the frequency of the output signal of the voltage controlled oscillator; a comparator, which receives an output signal of the first counter and an output signal of the second counter, compares the output signal of the first counter and the output signal of the second counter, and outputs a comparison signal as a result of the comparison; and a state machine, which receives the comparison signal from the comparator and outputs the control bits in response to the comparison signal.

The PLL may comprise a phase-frequency detector, which outputs error signals according to the input signal, and the output signal of the voltage controlled oscillator; a loop filter; a charge pump, which charges or discharges the loop filter according to the error signals; a first switch for connecting the loop filter and the voltage controlled oscillator in a phase lock mode; and a second switch for connecting a reference voltage source and the voltage controlled oscillator in the frequency lock mode.

In the phase lock mode, the voltage controlled oscillator may synchronize a phase of the input signal with a phase of the voltage controlled oscillator by adjusting the phase of the input signal according the operating characteristic curve selected in the frequency lock mode. The control bits may be comprised of N bits. The frequency synthesizer may further include a first divider, which receives a reference signal and generates the input signal; and a second divider, which is provided between the voltage controlled oscillator and the adaptive frequency calibration circuit. The frequency synthesizer is a fractional-N frequency synthesizer.

According to another aspect of the present invention, there is provided a frequency synthesizer. The frequency synthesizer includes a voltage controlled oscillator, which has a plurality of operating characteristic curves; a phase-frequency detector, which outputs error signals based on an input signal, and an output signal of the voltage controlled oscillator; a loop filter; a charge pump, which charges or discharges the loop filter based on the error signals; a first switch, which is connected between the loop filter and the voltage controlled oscillator; a second switch, which is connected between a reference voltage source and the voltage controlled oscillator; and an adaptive frequency calibration circuit, which receives the input signal, and the output signal of the voltage controlled oscillator, compares a frequency of the input signal with a frequency of the output signal of the voltage controlled oscillator, and outputs control bits as a result of the comparison, wherein the voltage controlled oscillator selects a curve from among the plurality of operating characteristic curves in response to the control bits.

The adaptive frequency calibration circuit may include a first counter, which receives the input signal and counts the frequency of the input signal; a second counter, which receives the output signal of the voltage controlled oscillator and counts the frequency of the output signal of the voltage controlled oscillator; a comparator, which receives an output signal of the first counter and an output signal of the second counter, compares the output signal of the first counter and the output signal of the second counter, and outputs a comparison signal as a result of the comparison; and a state machine, which receives the comparison signal from the comparator and outputs the control bits in response to the comparison signal.

The adaptive frequency calibration circuit may include a multiplier, which receives the input signal and multiplies the frequency of the input signal by an integer; a first counter, which receives a frequency output from the multiplier and counts the received frequency; a second counter, which receives the output signal of the voltage controlled oscillator and counts the frequency of the output signal of the voltage controlled oscillator; a comparator, which receives an output signal of the first counter and an output signal of the second counter, compares the output signal of the first counter and the output signal of the second counter, and outputs a comparison signal as a result of the comparison; and a state machine, which receives the comparison signal from the comparator and outputs the control bits in response to the comparison signal.

The first switch may be turned on in a phase lock mode, and the second switch may be turned on in a frequency lock mode. The voltage controlled oscillator may select a curve from among the plurality of operating characteristic curves in response to the control bits in the frequency lock mode. In the phase lock mode, the voltage controlled oscillator may synchronize a phase of the input signal with a phase of the voltage controlled oscillator based on a voltage of the loop filter from the operating characteristic curve selected in the frequency lock mode. The frequency synthesizer is a fractional-N frequency synthesizer.

According to another aspect of the present invention there is provided a method for adaptive frequency calibration. The method includes receiving, at an adaptive frequency calibration circuit, an input signal, and an output signal from a voltage controlled oscillator comprising a plurality of operating characteristic curves; comparing, at the adaptive frequency calibration circuit, a frequency of the input signal with a frequency of the output signal of the voltage controlled oscillator; outputting, from the adaptive frequency calibration circuit, control bits as a result of the comparison; and selecting, at the voltage controlled oscillator, a curve from the plurality of operating characteristic curves in response to the control bits when in a frequency lock mode.

The method further includes outputting, from a phase-frequency detector, an error signal in response to the input signal, and the output signal of the voltage controlled oscillator; performing, at a charge pump, one of a charging and a discharging of a loop filter in response to the error signal; connecting, with a first switch, the loop filter and the voltage controlled oscillator in a phase-lock mode; and connecting, with a second switch, a reference voltage source and the voltage controlled oscillator in the frequency lock mode.

The method also includes synchronizing, at the voltage controlled oscillator when in the phase lock mode, a phase of the input signal with a phase of the voltage controlled oscillator according to a voltage of the loop filter by adjusting the phase of the input signal according to the operating characteristic curve selected in the frequency lock mode. The first switch is turned on in the phase lock mode, and the second switch is turned on in the frequency lock mode.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS

Figure 1:
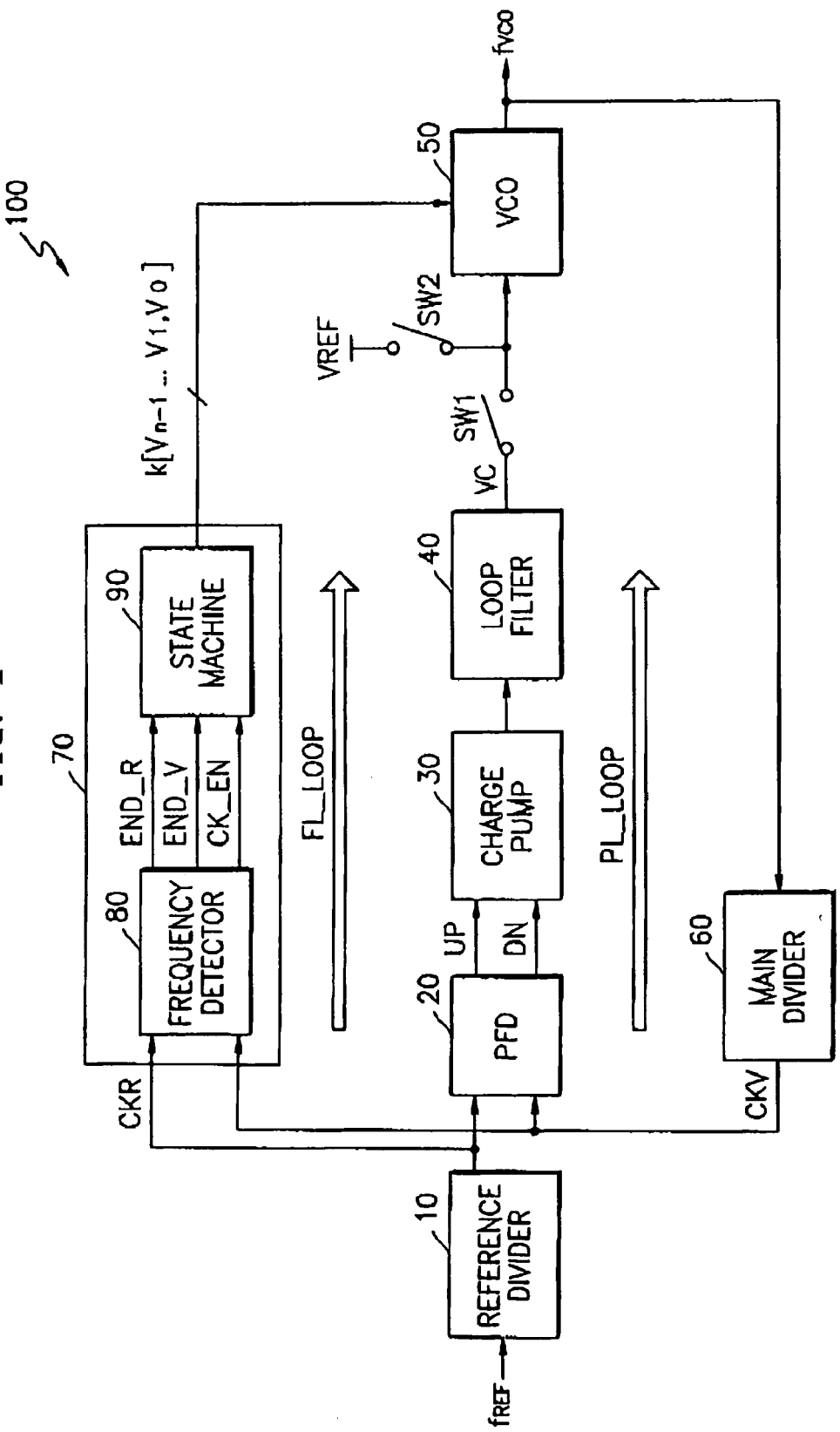
FIG. 1 is a block diagram of a frequency synthesizer according to an exemplary embodiment of the present invention.

FIG. 1 is a block diagram of a frequency synthesizer 100 according to an exemplary embodiment of the present invention. The frequency synthesizer 100 may be used in global system for mobile communication (GSM), general packet radio service (GPRS), and wideband code division multiple access (CDMA) applications.

The frequency synthesizer 100, which is a fractional-N frequency synthesizer, includes a reference divider 10, a phase-frequency detector 20, a charge pump 30, a loop filter 40, two switches SW1 and SW2, a voltage controlled oscillator 50, a main divider 60, and an adaptive frequency calibration circuit 70. The phase-frequency detector 20, the charge pump 30, the loop filter 40, the two switches SW1 and SW2, the voltage controlled oscillator 50, and the main divider 60 constitute a phase locked loop (PLL).

All the circuit blocks of the frequency synthesizer 100 except the loop filter 40 are integrated. In addition, all the circuit blocks of the frequency synthesizer 100 except the voltage controlled oscillator 50 may be formed of complimentary metal oxide silicon (CMOS) so that they can operate at a frequency of 1 GHz or higher.

The reference divider 10 receives a reference signal $f_{REF}$, divides the reference signal $f_{REF}$ by a predetermined value, for example, a predetermined real number, and outputs as a result of the division a signal CKR to the phase-frequency detector 20 and a frequency detector 80 of the adaptive frequency calibration circuit 70. The reference signal $f_{REF}$ may have a frequency of 13 MHz~26 MHz.

The phase-frequency detector 20 compares the phase of the signal CKR input thereto from the reference divider 10 with the phase of a feedback signal CKV and generates an error signal UP or DN according to a result of the comparison. If the phase of the input signal CKR leads the phase of the feedback signal CKV, the phase-frequency detector 20 generates an up signal UP. On the other hand, if the phase of the input signal CKR lags the phase of the feedback signal CKV, the phase-frequency detector 20 generates a down signal DN.

The charge pump 30 generates a charge corresponding to the error signal UP or DN output from the phase-frequency detector 20. The charge pump 30 charges the loop filter 40 or discharges the loop filter 40 in response to the error signal UP or DN. The structure of the loop filter 40 is known to those skilled in the art, and thus its description will not be presented here.

According to a switching signal, the switch SW1 may provide a voltage VC of the loop filter 40 to the voltage controlled oscillator 50, or the switch SW2 may provide a reference voltage VREF to the voltage controlled oscillator 50.

The frequency synthesizer 100 may have two different operation modes, i.e., a frequency lock mode and a phase lock mode.

In the frequency lock mode, the switch SW2 is turned on, and the switch SW1 is turned off. Accordingly, the reference divider 10 and the adaptive frequency calibration circuit 70 constitute a frequency-lock loop FL_LOOP. Then, the frequency synthesizer 100 selects an appropriate curve from a set of operating characteristic curves shown in FIG. 4 by using the adaptive frequency calibration circuit 70 and the voltage controlled oscillator 50.

In the phase-lock mode, the switch SW1 is turned on, and the switch SW2 is turned off. Accordingly, the phase-frequency detector 20, the charge pump 30, and the loop filter 40 constitute the PLL. Then, the frequency synthesizer 100 performs normal PLL operations.

The voltage controlled oscillator 50 generates an output signal $f_{VCO}$ using control bits $k[V_{n-1} \ldots V_1, V_0]$ output from the adaptive frequency calibration circuit 70 and the voltage VC of the loop filter 40. The control bits $k[V_{n-1} \ldots V_1, V_0]$ are comprised of N bits (where N is a natural number). The voltage controlled oscillator 50 has the plurality of operating characteristic curves shown in FIG. 4.

The main divider 60 receives the output signal $f_{VCO}$ of the voltage controlled oscillator 50, divides the output signal $f_{vco}$ by a predetermined value (e.g., a real number), and outputs as a result of the division the feedback signal CKV to the phase-frequency detector 20 and the frequency detector 80.

The adaptive frequency calibration circuit 70 includes the frequency detector 80 and a state machine 90. In the frequency lock mode, the adaptive frequency calibration circuit 70 outputs the control bits $k[V_{n-1} \ldots V_1, V_0]$ according to a result of comparing the frequency of the input signal CKR with the frequency of the feedback signal CKV.

In the frequency lock mode, the voltage controlled oscillator 50 selects a curve from among the plurality of operating characteristic curves based on the control bits $k[V_{n-1} \ldots V_1, V_0]$.

Figure 2:
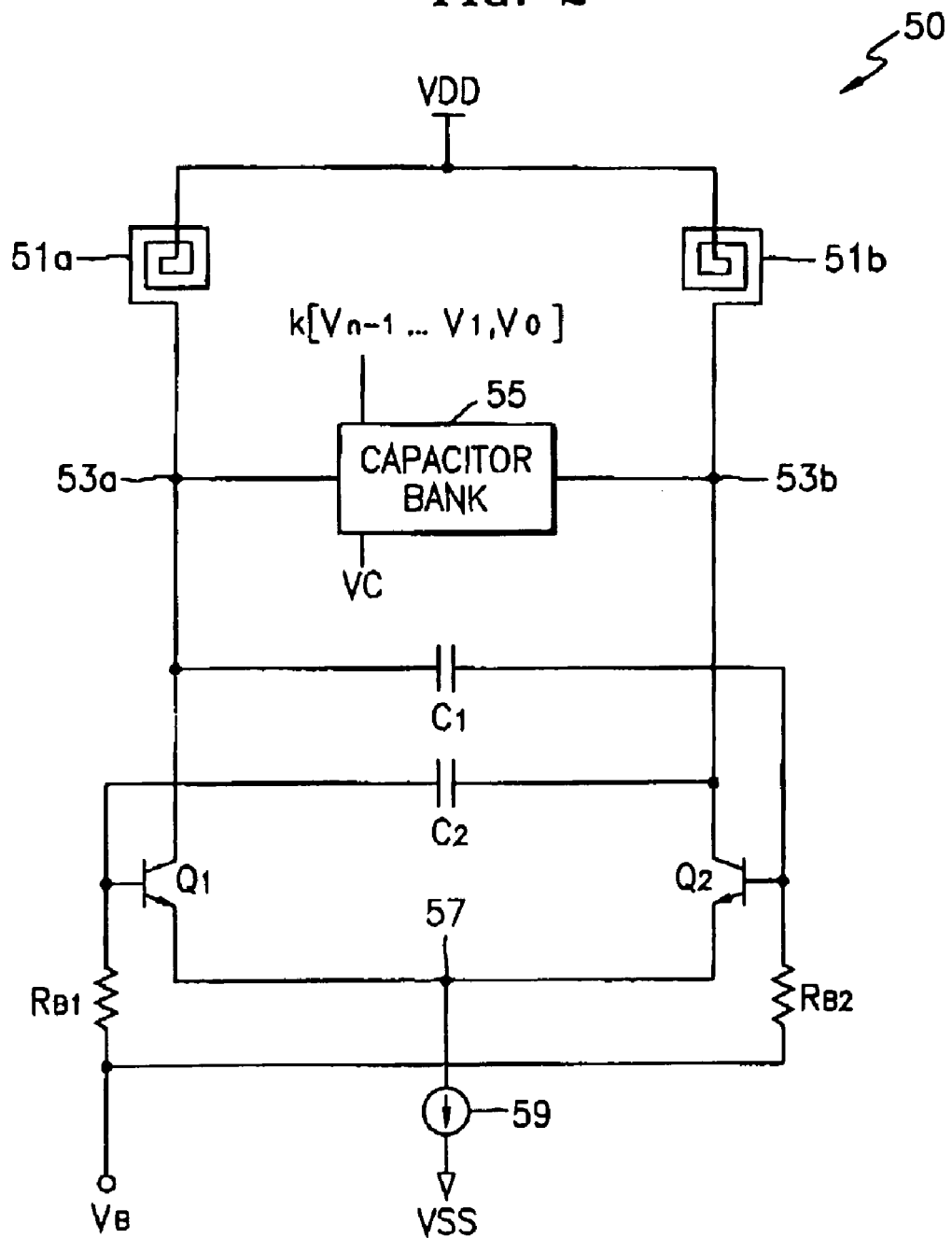
FIG. 2 is a circuit diagram of a voltage controlled oscillator of FIG. 1.

FIG. 2 is a circuit diagram of the voltage controlled oscillator 50 of FIG. 1. In FIG. 2, a spiral inductor 51a is connected between a power supply VDD and a node 53a, and a spiral inductor 51b is connected between the power supply VDD and a node 53b. A capacitor bank 55 is connected between the nodes 53a and 53b. Capacitance of the capacitor bank 55 is determined by the control bits $k[V_{n-1}, \ldots V_1, V_0]$ and the voltage VC of the loop filter 40.

A capacitor C1 is connected between the node 53a and a gate of a transistor Q2, and a capacitor C2 is connected between the node 53b and a gate of a transistor Q1. The transistor Q1 is connected between the node 53a and a node 57, and a bias voltage VB is input into the gate of the transistor Q1 via a resistor $R_{B1}$. The transistor Q2 is connected between the node 53b and the node 57, and the bias voltage VB is input into the gate of the transistor Q2 via a resistor $R_{B2}$. Reference numeral 59 represents current flowing through a bias resistor (not shown).

Figure 3:
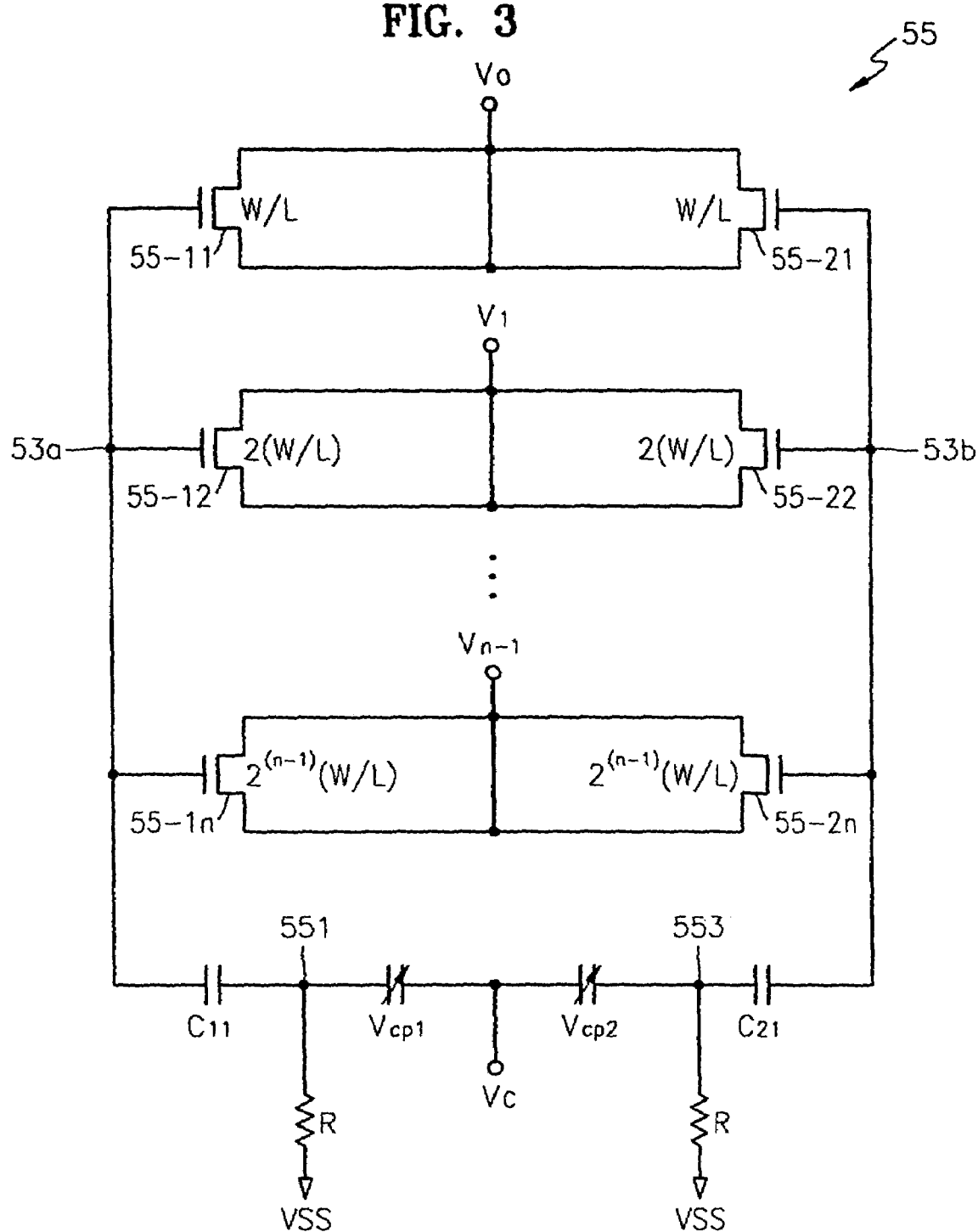
FIG. 3 is a circuit diagram of a capacitor bank of FIG. 2.

FIG. 3 is a circuit diagram of the capacitor bank 55 of FIG. 2. Referring to FIGS. 1 and 3, each transistor 55-11 and 55-21 has a drain connected to its respective source, and a least significant (LSB) bit $V_0$ of the control bits $k[V_{n-1} \ldots V_1, V_0]$ is input into the drain of each of the transistors 55-11 and 55-21. The transistors 55-11 and 55-21 have a β ratio of 1. In other words, the transistors 55-11 and 55-21 have a channel width-to channel length ratio (W/L) of 1.

The drain of a transistor 55-12 is connected to the source of the transistor 55-12, and the drain of a transistor 55-22 is connected to the source of the transistor 55-22. A second bit $V_1$ of the control bits $k[V_{n-1} \ldots V_1, V_0]$ is input into the drain of each of the transistors 55-12 and 55-22. Each of the transistors 55-12 and 55-22 has a β ratio of 2, i.e., a channel width-to channel length ratio (W/L) of 2.

The drain of a transistor 55-1n is connected to the source of the transistor 55-1n, and the drain of a transistor 55-2n is connected to the source of the transistor 55-2n. A most significant bit (MSB) $V_{n-1}$ of the control bits $k[V_{n-1} \ldots V_1, V_0]$ is input into the drain of each of the transistors 55-1n and 55-2n. Each of the transistors 55-1n and 55-2n has a β ratio of $2^{n-1}$, i.e., a channel width-to channel length ratio (W/L) of $2^{n-1}$.

The gates of each of the transistors 55-11, 55-12 ... 55-1n are connected to a node 551 via a capacitor C11, and the gates of each of the transistors 55-21, 55-22 ... 55-2n are connected to a node 553 via a capacitor C21. The voltage VC of the loop filter 40 is input into the node 551 via a varactor diode $V_{cp1}$ and into the node 553 via a varactor diode $V_{cp2}$. The nodes 551 and 553 are connected to the ground voltage VSS via their respective resistors R.

Figure 4:
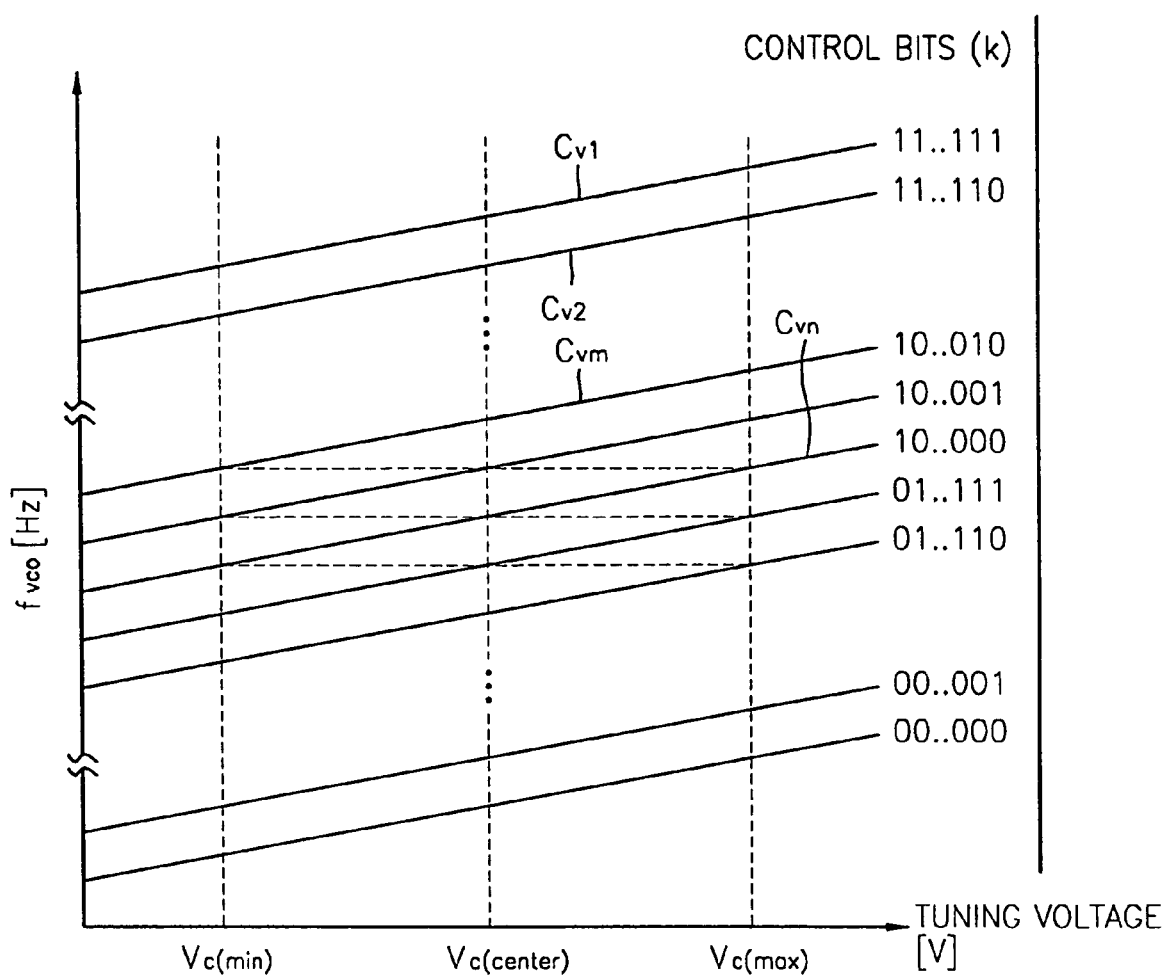
FIG. 4 is a graph illustrating a set of operating characteristic curves of the voltage controlled oscillator of FIG. 1.

FIG. 4 is a graph illustrating a set of operating characteristic curves of the voltage controlled oscillator 50 of FIG. 1. Referring to FIGS. 1 through 4, the oscillation frequency $f_{VCO}$ of the voltage controlled oscillator 50 can be expressed by a function of the voltage of the loop filter 40, i.e., the tuning voltage VC, and the control bits (k), as shown below in Equation (1).

$$f_{VCO} = f(VC, k) = \frac{1}{2\pi\sqrt{LC}} \quad (1)$$

$$C = C_m + C_v + C_k$$

$$C_v = f(VC)$$

$$C_k = f(k) = C_{K0}(2^K - 2^k)$$

In Equation (1), $C_m$ represents a main capacitance, $C_v$ represents a capacitance of the varactor diodes $V_{cp1}$ and $V_{cp2}$, $C_k$ represents a capacitance of the capacitor bank 55, $C_{K0}$ represents a unit capacitance of the capacitor bank 55, K represents a total number of bits of the adaptive frequency calibration circuit 70, k represents control bits of the adaptive frequency calibration circuit 70, and L represents an equivalent inductance of the voltage controlled oscillator 50.

Figure 5:
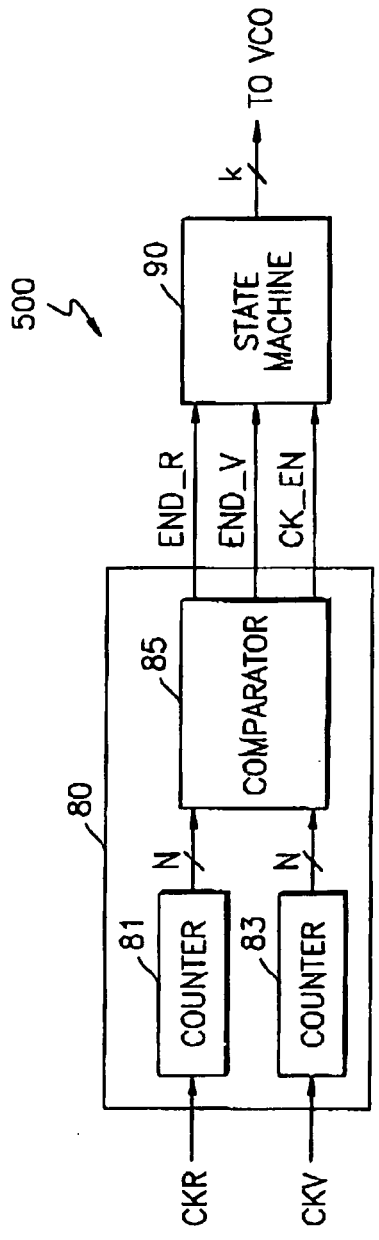
FIG. 5 is a block diagram of an exemplary adaptive frequency calibration circuit.

FIG. 5 is a block diagram of an exemplary adaptive frequency calibration circuit 500 for use with the frequency synthesizer 100 of FIG. 1. Referring to FIG. 5, the adaptive frequency calibration circuit 500 includes a frequency detector 80 and a state machine 90.

The frequency detector 80 includes a first counter 81, a second counter 83, and a comparator 85. The first and second counters 81 and 83 could be up-counters. Alternatively, the first and second counters 81 and 83 could be down-counters.

The first counter 81 receives an input signal CKR, counts the frequency of the input signal CKR, and outputs a result of the counting, which is comprised of N bits, to the comparator 85 as a first counting result. The second counter 83 receives a feedback signal CKV, counts the frequency of the feedback signal CKV, and outputs a result of the counting, which is comprised of N bits, to the comparator 85 as a second counting result. Here, N is a natural number.

The comparator 85 receives the first and second counting results, compares them on a bit-by-bit basis, and outputs as a result of the comparison a signal END_R or END_V, and a state machine enable signal CK_EN to the state machine 90.

Here, the comparison result signal END_R indicates that the first counting result is larger than the second counting result, and the comparison result signal END_V indicates that the second counting result is larger than the first counting result. The state machine enable signal CK_EN enables the state machine 90 and also serves as a clock signal.

The state machine 90 outputs the control bits k, which are comprised of N bits, to the voltage controlled oscillator 50 in response to the comparison result signal END_R or END_V, and the state machine enable signal CK_EN.

Figure 6:
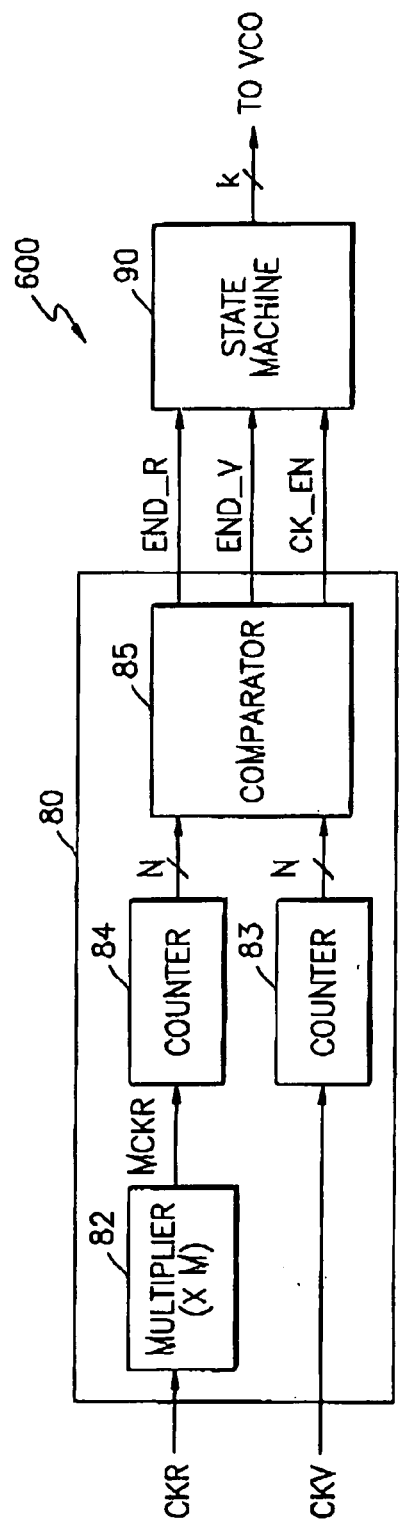
FIG. 6 is a block diagram of another exemplary adaptive frequency calibration circuit.

FIG. 6 is a block diagram of another exemplary adaptive frequency calibration circuit 600 for use with the frequency synthesizer 100 of FIG. 1. Referring to FIG. 6, the adaptive frequency calibration circuit 600 includes all the elements of the adaptive frequency calibration circuit 500 of FIG. 5 and further includes a multiplier 82.

The multiplier 82 receives an input signal CKR, multiplies the frequency of the input signal CKR by a predetermined integer M (where M is a real number), and outputs a multiplication result MCKR to a first counter 84. The first counter 84 receives the output signal MCKR of the multiplier 82, counts the frequency of the output signal MCKR, and outputs a counting result to a comparator 85 as a first counting result, which is comprised of N bits.

Figure 7:
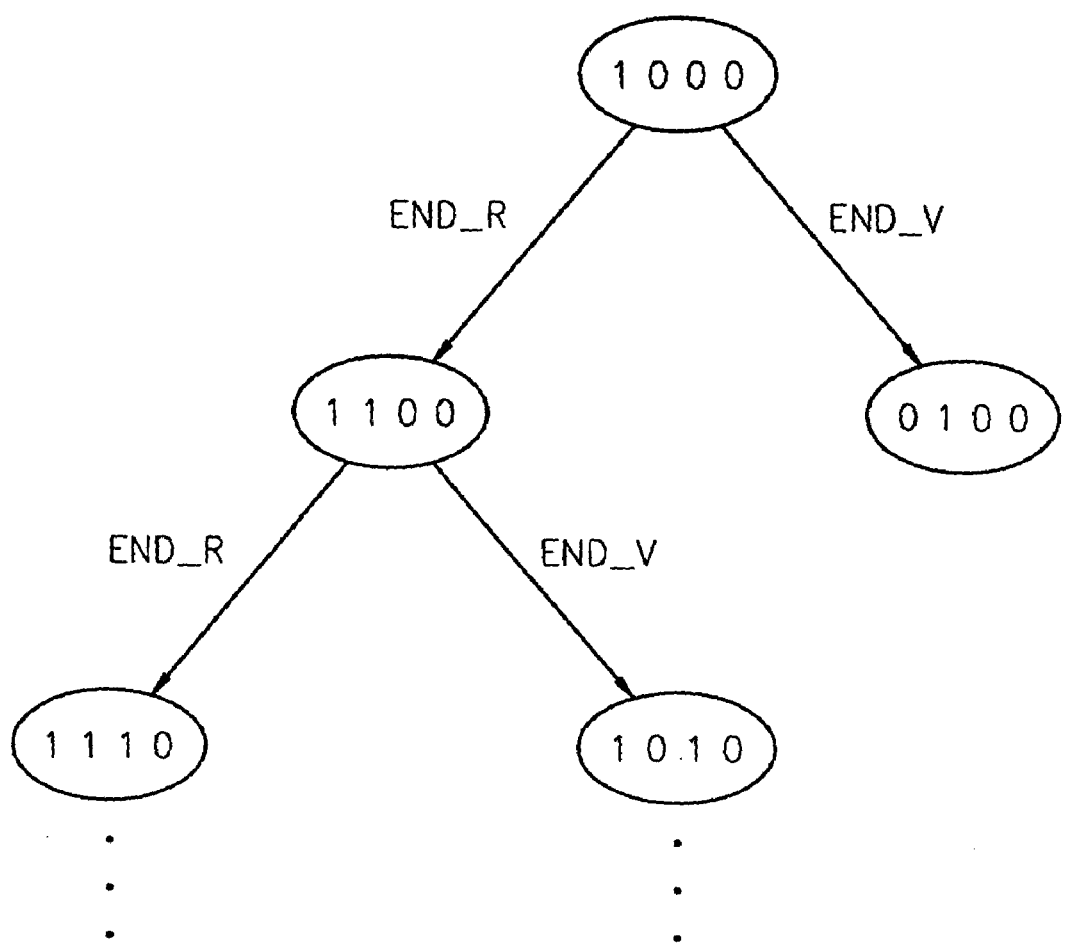
FIG. 7 is a diagram illustrating the operation of a state machine of FIG. 1.

FIG. 7 is a diagram illustrating the operation of the state machine 90 of FIG. 1. It is assumed that the control bits k are comprised of 4 bits and an initial value of the control bits k is '1000' for the convenience of explanation. However, the number of bits constituting the control bits k of the adaptive frequency calibration circuit 70 of FIG. 1 is not restricted to the number of bits shown in FIG. 7.

As discussed above with reference to FIG. 1, in the frequency lock mode, the switch SW2 is turned on, and the switch SW1 is turned off. The operation of the reference divider 10 and the main divider 60 has already been described above with reference to FIG. 1, thus only aspects of the present invention which were not mentioned above will be described now in greater detail.

A first counter 81 (of FIG. 5 or 6) of the frequency detector 80 receives the signal CKR output from the reference divider 10, counts the frequency of the received signal CKR, and outputs a counting result, which is comprised of N bits, to a comparator 85 (of FIG. 5 or 6) as a first counting result. A second counter 83 (of FIG. 5 or 6) receives the signal CKV output from the main divider 60, counts the frequency of the received signal CKV, and outputs a counting result, which is comprised of N bits, to the comparator 85 as a second counting result. The comparator 85 then compares the first and second counting results on a bit-by-bit basis, and outputs as a result of the comparison signals END_R or END_V, and the state machine enable signal CK_EN to the state machine 90.

For example, if the comparator 85 outputs the comparison result signal END_R, and the state machine enable signal CK_EN to the state machine 90, the state machine 90 outputs '1100' to the voltage controlled oscillator 50 as the control bits k. Thereafter, the voltage controlled oscillator 50 selects one curve that corresponds to '1100' from among the plurality of operating characteristic curves shown in FIG. 4. The capacitor bank 55 (of FIG. 2) of the voltage controlled oscillator 50 is set to have a capacitance that corresponds to '1100'. Therefore, the output frequency $f_{VCO}$ of the voltage controlled oscillator 50 is determined using Equation (1) above.

If the comparator 85 outputs the comparison result signal END_V and the state machine enable signal CK_EN to the state machine 90, the state machine 90 outputs '1010' to the voltage controlled oscillator 50 as the control bits k. Thereafter, the voltage controlled oscillator 50 selects one curve that corresponds to '1010' from among the plurality of operating characteristic curves shown in FIG. 4. The capacitor bank 55 of the voltage controlled oscillator 50 is set to have a capacitance that corresponds to '1010'.

In short, the adaptive frequency calibration circuit 70 compares the frequency of the output signal CKR of the reference divider 10 with the frequency of the output signal CKV of the main divider 60 and outputs the control bits k as a result of the comparison. The voltage controlled oscillator 50 selects one of the plurality of operating characteristic curves in response to the control bits k, which are generated when the frequency of the output signal CKR of the reference divider 10 is the same as the frequency of the output signal CKV of the main divider 60.

Figure 8A:
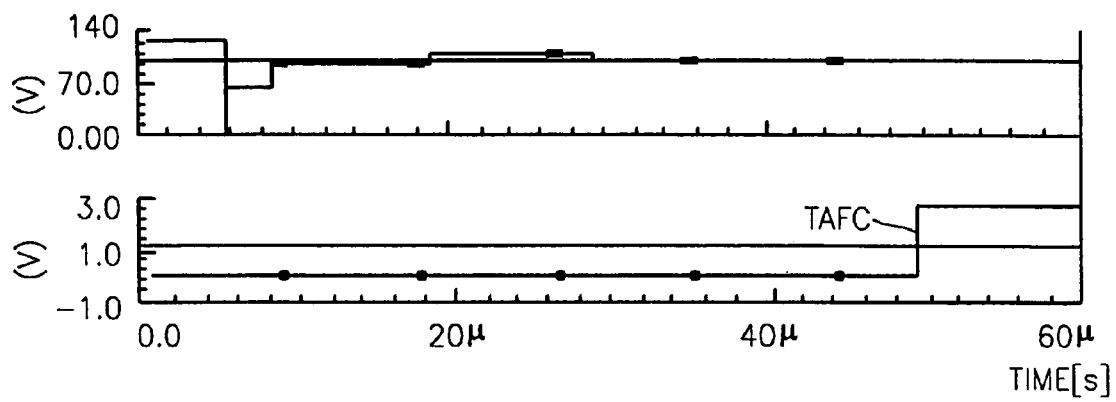
FIG. 8A is a graph illustrating a transient response of the adaptive frequency calibration circuit of FIG. 5.

FIG. 8A is a diagram illustrating a transient response of the adaptive frequency calibration circuit 500 of FIG. 5. More specifically, FIG. 8A illustrates the amount of time taken by a frequency-lock mode (TAFC) in a case where the frequency detector 80 does not include the multiplier 82. The amount of time taken by the frequency-lock mode (TAFC) represents the amount of time taken for the adaptive frequency calibration circuit 500 to search for the control bits k in the frequency-lock mode. Referring to FIG. 8A, the TAFC is 49.4 μs.

Figure 8B:
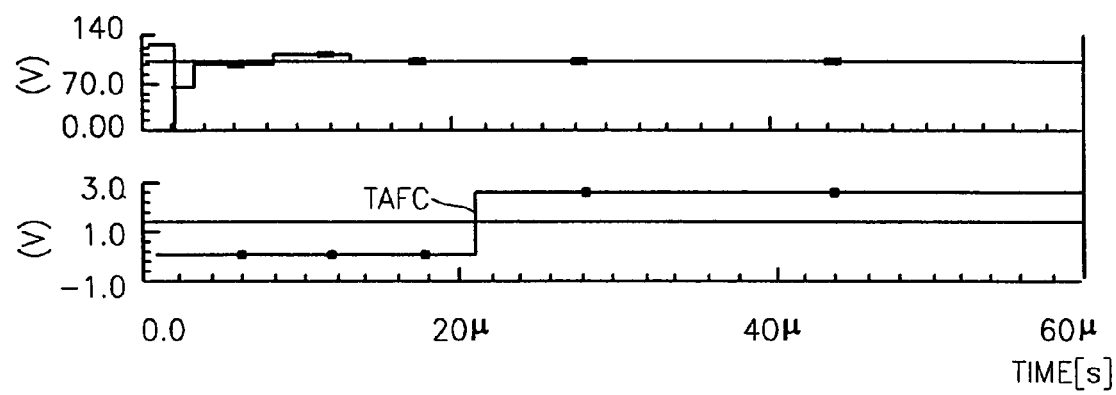
FIG. 8B is a graph illustrating a transient response of the adaptive frequency calibration circuit of FIG. 6.

FIG. 8B is a graph illustrating a transient response of the adaptive frequency calibration circuit 600 of FIG. 6. More specifically, FIG. 8B illustrates the TAFC in a case where a multiplication coefficient M of the multiplier 82 is set to 2. Referring to FIG. 8B, the TAFC is 21.2 μs.

Figure 8C:
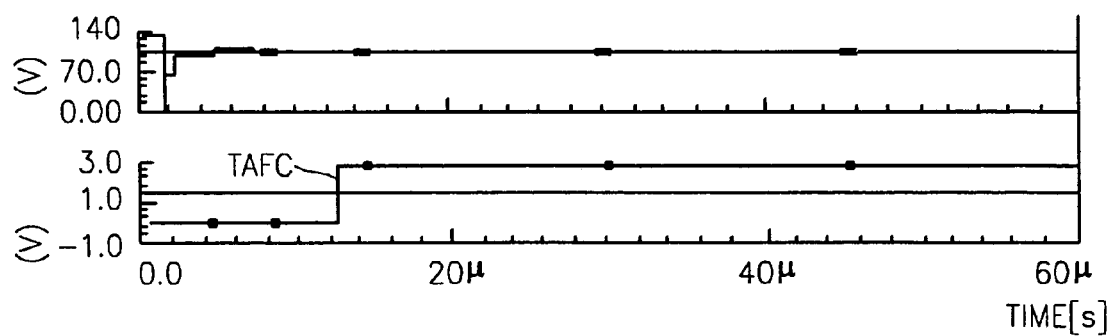
FIG. 8C is a graph illustrating another transient response of the adaptive frequency calibration circuit of FIG. 6.

FIG. 8C is a graph illustrating another transient response of the adaptive frequency calibration circuit 600 of FIG. 6. More specifically, FIG. 8C illustrates the TAFC in a case where the multiplication of the multiplier 82 is set to 4. Referring to FIG. 8C, the TAFC is 12.6 μs.

Referring to FIGS. 8A through 8C, the larger the multiplication coefficient M of the multiplier 82, the lower the TAFC value, i.e., less is time taken by the frequency-lock mode for an adaptive frequency calibration circuit to search for the control bits k.

If the control bits k are quickly determined in a frequency-lock mode, the voltage controlled oscillator 50 selects an operating characteristic curve (of FIG. 4) that corresponds to the determined control bits k and operates at the center $V_c$ of the selected operating characteristic curve. The voltage controlled oscillator 50 precisely adjusts its phase while moving along the selected operating characteristic curve in response to the tuning voltage VC, which ranges from $V_{c(min)}$ to $V_{c(max)}$. In other words, the frequency synthesizer 100 precisely adjusts the phase of the voltage controlled oscillator 50 in the phase lock mode after quickly determining the control bits k in the frequency-lock mode. Thus, the frequency synthesizer can reduce setting time and precisely control the setting time.

In accordance with at least one embodiment of the present invention, the adaptive frequency calibration method using the adaptive frequency calibration circuits, which have been described above, can increase an operating frequency band of a voltage controlled oscillator while reducing a lock time of a frequency synthesizer. In addition, the adaptive frequency calibration method can be used to correct central frequency errors of the voltage controlled oscillator that may occur depending on the type of process, pressure, and supply voltage applied to the frequency synthesizer.

In addition, the frequency synthesizer can achieve a small gain for a voltage controlled oscillator but a wide frequency band using a small amount of supply voltage. Therefore, the frequency synthesizer according to the present invention can generate precise frequencies in a variety of RF transmission and reception systems, such as GSM, GPRS, CDMA, wideband CDMA, and Bluetooth.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A frequency synthesizer, comprising:
   a phase locked loop (PLL);
   a voltage controlled oscillator, which comprises a plurality of operating characteristic curves; and
   an adaptive frequency calibration circuit, which, in a frequency lock mode, receives an input signal, and an output signal of the voltage controlled oscillator, compares a frequency of the input signal with a frequency of the output signal of the voltage controlled oscillator, and outputs control bits as a result of the comparison,
   wherein the adaptive frequency calibration circuit comprises:
   a first counter, which receives the input signal and counts the frequency of the input signal;
   a second counter, which receives the output signal of the voltage controlled oscillator and counts the frequency of the output signal of the voltage controlled oscillator;
   a comparator, which receives an output signal of the first counter and an output signal of the second counter, compares the output signal of the first counter and the output signal of the second counter, and outputs a comparison signal as a result of the comparison; and
   a state machine, which receives the comparison signal from the comparator and outputs the control bits in response to the comparison signal,
   wherein the voltage controlled oscillator selects a curve from among the plurality of operating characteristic curves in the frequency lock mode in response to the control bits.

2. The frequency synthesizer of claim 1, wherein the PLL comprises:
   a phase-frequency detector, which outputs error signals according to the input signal, and the output signal of the voltage controlled oscillator;
   a loop filter;
   a charge pump, which charges or discharges the loop filter according to the error signals;
   a first switch for connecting the loop filter and the voltage controlled oscillator in a phase lock mode; and
   a second switch for connecting a reference voltage source and the voltage controlled oscillator in the frequency lock mode.

3. The frequency synthesizer of claim 2, when in the phase lock mode, the voltage controlled oscillator synchronizes a phase of the input signal with a phase of the voltage controlled oscillator according to a voltage of the loop filter by adjusting the phase of the input signal according to the operating characteristic curve selected in the frequency lock mode.

4. The frequency synthesizer of claim 1, wherein the control bits are comprised of N bits.

5. The frequency synthesizer of claim 1, further comprising:
   a first divider, which receives a reference signal and generates the input signal.

6. The frequency synthesizer of claim 1, further comprising:
   a second divider, which is provided between the voltage controlled oscillator and the adaptive frequency calibration circuit.

7. The frequency synthesizer of claim 1, wherein the frequency synthesizer is a fractional-N frequency synthesizer.

8. A frequency synthesizer, comprising:
   a voltage controlled oscillator, which comprises a plurality of operating characteristic curves;
   a phase-frequency detector, which outputs error signals based on an input signal, and an output signal of the voltage controlled oscillator;
   a loop filter;
   a charge pump, which charges or discharges the loop filter based on the error signals;
   a first switch, which is connected between the loop filter and the voltage controlled oscillator;
   a second switch, which is connected between a reference voltage source and the voltage controlled oscillator; and
   an adaptive frequency calibration circuit, which receives the input signal, and the output signal of the voltage controlled oscillator, compares a frequency of the input signal with a frequency of the output signal of the voltage controlled oscillator, and outputs control bits as a result of the comparison,
   wherein the adaptive frequency calibration circuit comprises:
   a first counter, which receives the input signal and counts the frequency of the input signal;
   a second counter, which receives the output signal of the voltage controlled oscillator and counts the frequency of the output signal of the voltage controlled oscillator;
   a comparator, which receives an output signal of the first counter and an output signal of the second counter, compares the output signal of the first counter and the output signal of the second counter, and outputs a comparison signal as a result of the comparison; and
   a state machine, which receives the comparison signal from the comparator and outputs the control bits in response to the comparison signal, wherein the voltage controlled oscillator selects a curve from among the plurality of operating characteristic curves in response to the control bits.

9. The frequency synthesizer of claim 8, wherein the first switch is turned on in a phase lock mode, and the second switch is turned on in a frequency lock mode.

10. The frequency synthesizer of claim 8, wherein the voltage controlled oscillator selects a curve from among the plurality of operating characteristic curves in response to the control bits in a frequency lock mode.

11. The frequency synthesizer of claim 10, wherein in a phase lock mode, the voltage controlled oscillator synchronizes a phase of the input signal with a phase of the voltage controlled oscillator based on a voltage of the loop filter from the operating characteristic curve selected in the frequency lock mode.

12. The frequency synthesizer of claim 8, wherein the frequency synthesizer is a fractional-N frequency synthesizer.

13. A method for adaptive frequency calibration, comprising:
receiving, at an adaptive frequency calibration circuit, an input signal, and an output signal from a voltage controlled oscillator comprising a plurality of operating characteristic curves;
counting, at the adaptive frequency calibration circuit, a frequency of the input signal, and a frequency of the output signal of the voltage controlled oscillator;
comparing, at the adaptive frequency calibration circuit, the frequency of the input signal with the frequency of the output signal of the voltage controlled oscillator;
outputting, from the adaptive frequency calibration circuit, control bits as a result of the comparison; and
selecting, at the voltage controlled oscillator, a curve from the plurality of operating characteristic curves in response to the control bits when in a frequency lock mode.

14. The method of claim 13, further comprising:
outputting, from a phase-frequency detector, an error signal in response to the input signal, and the output signal of the voltage controlled oscillator;
performing, at a charge pump, one of a charging and a discharging of a loop filter in response to the error signal;
connecting, with a first switch, the loop filter and the voltage controlled oscillator in a phase-lock mode; and
connecting, with a second switch, a reference voltage source and the voltage controlled oscillator in the frequency lock mode.

15. The method of claim 14, further comprising:
synchronizing, at the voltage controlled oscillator when in the phase lock mode, a phase of the input signal with a phase of the voltage controlled oscillator according to a voltage of the loop filter by adjusting the phase of the input signal according to the operating characteristic curve selected in the frequency lock mode.

16. The method of claim 14, wherein the first switch is turned on in the phase lock mode, and the second switch is turned on in the frequency lock mode.

17. A frequency synthesizer, comprising:
a phase locked loop (PLL);
a voltage controlled oscillator, which comprises a plurality of operating characteristic curves; and
an adaptive frequency calibration circuit, which, in a frequency lock mode, receives an input signal, and an output signal of the voltage controlled oscillator, compares a frequency of the input signal with a frequency of the output signal of the voltage controlled oscillator, and outputs control bits as a result of the comparison,
wherein the adaptive frequency calibration circuit comprises:
a multiplier, which receives the input signal and multiplies the frequency of the input signal by an integer;
a first counter, which receives a frequency output from the multiplier and counts the received frequency;
a second counter, which receives the output signal of the voltage controlled oscillator and counts the frequency of the output signal of the voltage controlled oscillator;
a comparator, which receives an output signal of the first counter and an output signal of the second counter, compares the output signal of the first counter and the output signal of the second counter, and outputs a comparison signal as a result of the comparison; and
a state machine, which receives the comparison signal from the comparator and outputs the control bits in response to the comparison signal,
wherein the voltage controlled oscillator selects a curve from among the plurality of operating characteristic curves in the frequency lock mode in response to the control bits.

18. A frequency synthesizer, comprising:
a voltage controlled oscillator, which comprises a plurality of operating characteristic curves;
a phase-frequency detector, which outputs error signals based on an input signal, and an output signal of the voltage controlled oscillator;
a loop filter;
a charge pump, which charges or discharges the loop filter based on the error signals;
a first switch, which is connected between the loop filter and the voltage controlled oscillator;
a second switch, which is connected between a reference voltage source and the voltage controlled oscillator; and
an adaptive frequency calibration circuit, which receives the input signal, and the output signal of the voltage controlled oscillator, compares a frequency of the input signal with a frequency of the output signal of the voltage controlled oscillator, and outputs control bits as a result of the comparison,
wherein the adaptive frequency calibration circuit comprises:
a multiplier, which receives the input signal and multiplies the frequency of the input signal by an integer;
a first counter, which receives a frequency output from the multiplier and counts the received frequency;
a second counter, which receives the output signal of the voltage controlled oscillator and counts the frequency of the output signal of the voltage controlled oscillator;
a comparator, which receives an output signal of the first counter and an output signal of the second counter, compares the output signal of the first counter and the output signal of the second counter, and outputs a comparison signal as a result of the comparison; and
a state machine, which receives the comparison signal from the comparator and outputs the control bits in response to the comparison signal,
wherein the voltage controlled oscillator selects a curve from among the plurality of operating characteristic curves in response to the control bits.

* * * * *